(12) United States Patent
Little et al.

(10) Patent No.: US 9,762,009 B2
(45) Date of Patent: Sep. 12, 2017

(54) PLUG CONNECTOR INSERTABLE IN TWO ORIENTATIONS AND HAVING A METALLIC SHIELD PLATE WITH ARMS WITH HOOK STRUCTURES

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Chih-Kai Yang, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/161,295

(22) Filed: May 23, 2016

(65) Prior Publication Data
US 2016/0268744 A1    Sep. 15, 2016

Related U.S. Application Data

(63) Continuation of application No. 14/542,550, filed on Nov. 15, 2014, now Pat. No. 9,350,126, which is a
(Continued)

(51) Int. Cl.
*H01R 13/648* (2006.01)
*H01R 24/60* (2011.01)
(Continued)

(52) U.S. Cl.
CPC ......... *H01R 24/60* (2013.01); *H01R 13/6581* (2013.01); *H01R 13/6591* (2013.01);
(Continued)

(58) Field of Classification Search
CPC ............... H01R 12/724; H01R 13/642; H01R 13/6581; H01R 13/6582; H01R 13/6591;
(Continued)

(56) References Cited

U.S. PATENT DOCUMENTS 5,073,130 A    12/1991    Nakamura
6,755,689 B2    6/2004    Zhang et al.
(Continued)

FOREIGN PATENT DOCUMENTS

CM    CN201868687 U    6/2011
CN    1253402 A    5/2000
(Continued)

OTHER PUBLICATIONS

USB Type-C Specification 0.9c05—20140518.
(Continued)

*Primary Examiner* — Chandrika Prasad
(74) *Attorney, Agent, or Firm* — Wei Te Chung; Ming Chieh Chang

(57) ABSTRACT

A plug connector includes an insulative housing with mating slot, contacts disposed in the housing by two sides of the mating slot, and a pair of side arms located by two opposite ends of the mating slot in a horizontal transverse direction. a receptacle connector includes an insulative housing defining a horizontal mating tongue; contacts disposed in the housing with contacting sections exposed upon two opposite surfaces of the mating tongue; and a monolithic horizontal metallic shielding plate disposed and extending substantially fully the mating tongue. The shielding plate defines side protruding edge sections exposed outside of corresponding side edges of the mating tongue and a notch structure on each side protruding edge section, the pair of side arms each defines a hook structure to engagement with the notch structure.

20 Claims, 21 Drawing Sheets

Related U.S. Application Data continuation-in-part of application No. 14/497,205, filed on Sep. 25, 2014, now Pat. No. 9,472,910, and a continuation-in-part of application No. 14/517,941, filed on Oct. 20, 2014, now Pat. No. 9,496,662, and a continuation-in-part of application No. 14/477,889, filed on Sep. 5, 2014, now Pat. No. 9,525,223, which is a continuation-in-part of application No. 14/454,737, filed on Aug. 8, 2014, now Pat. No. 9,525,227, which is a continuation-in-part of application No. 14/337,180, filed on Jul. 21, 2014, now Pat. No. 9,318,853.

(60) Provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/947,232, filed on Mar. 3, 2014, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.

| | |
|---|---|
| *H01R 13/6581* | (2011.01) |
| *H01R 13/66* | (2006.01) |
| *H01R 13/6591* | (2011.01) |
| *H01R 24/30* | (2011.01) |
| *H01R 12/72* | (2011.01) |
| *H01R 13/642* | (2006.01) |
| *H01R 13/6582* | (2011.01) |
| *H01R 24/28* | (2011.01) |
| *H01R 107/00* | (2006.01) |
| *H05K 1/11* | (2006.01) |
| *H05K 1/18* | (2006.01) |

(52) U.S. Cl.
CPC ......... *H01R 13/6658* (2013.01); *H01R 24/30* (2013.01); *H01R 12/724* (2013.01); *H01R 13/642* (2013.01); *H01R 13/6582* (2013.01); *H01R 24/28* (2013.01); *H01R 2107/00* (2013.01); *H05K 1/117* (2013.01); *H05K 1/184* (2013.01); *H05K 2201/10189* (2013.01)

(58) Field of Classification Search
CPC .... H01R 13/6658; H01R 24/28; H01R 24/30; H01R 24/60; H01R 2107/00
USPC .................................................. 439/607.34
See application file for complete search history.

(56) References Cited

U.S. PATENT DOCUMENTS

| | | | |
|---|---|---|---|
| 7,758,379 B2 | 7/2010 | Chen | |
| 8,087,944 B2 | 1/2012 | Kumamoto et al. | |
| 8,517,773 B2 | 8/2013 | Lee et al. | |
| 8,968,031 B2 | 3/2015 | Simmel et al. | |
| 9,356,400 B2 * | 5/2016 | Little | H01R 4/023 |
| 9,472,910 B2 * | 10/2016 | Little | H01R 24/60 |
| 9,472,911 B2 * | 10/2016 | Little | H01R 24/60 |
| 9,490,584 B2 * | 11/2016 | Little | H01R 13/6581 |
| 9,502,821 B2 * | 11/2016 | Little | H01R 13/6582 |
| 9,525,223 B2 * | 12/2016 | Little | H01R 13/6658 |
| 2007/0049100 A1 | 3/2007 | Tsai | |
| 2009/0156027 A1 | 6/2009 | Chen | |
| 2010/0267261 A1 | 10/2010 | Lin | |
| 2013/0095702 A1 | 4/2013 | Golko et al. | |
| 2014/0024257 A1 | 1/2014 | Castillo et al. | |
| 2015/0044886 A1 * | 2/2015 | Little | H01R 12/75 439/55 |
| 2015/0056839 A1 | 2/2015 | Zhang | |
| 2015/0093936 A1 * | 4/2015 | Little | H01R 13/6583 439/607.19 |
| 2015/0126069 A1 * | 5/2015 | Little | H01R 24/60 439/607.55 |
| 2015/0162684 A1 | 6/2015 | Amini et al. | |
| 2015/0171561 A1 * | 6/2015 | Little | H01R 24/60 439/607.34 |
| 2015/0171562 A1 | 6/2015 | Gao et al. | |
| 2015/0214673 A1 | 7/2015 | Gao et al. | |
| 2015/0214674 A1 | 7/2015 | Simmel et al. | |
| 2015/0255905 A1 * | 9/2015 | Little | H01R 13/6658 439/78 |
| 2015/0295362 A1 | 10/2015 | Tziviskos et al. | |
| 2015/0340813 A1 | 11/2015 | Ng et al. | |
| 2015/0340815 A1 | 11/2015 | Gao et al. | |
| 2015/0340825 A1 | 11/2015 | Ng et al. | |
| 2015/0372424 A1 * | 12/2015 | Little | H01R 13/642 439/217 |
| 2016/0036167 A1 * | 2/2016 | Kuang | H01R 13/6586 439/607.34 |

FOREIGN PATENT DOCUMENTS

| | | |
|---|---|---|
| CN | 2454802 Y | 10/2001 |
| CN | 2724249 Y | 9/2005 |
| CN | 2728006 Y | 9/2005 |
| CN | 201029143 Y | 2/2008 |
| CN | 201078847 Y | 6/2008 |
| CN | 201230066 Y | 4/2009 |
| CN | 101573840 A | 11/2009 |
| CN | 201623280 U | 11/2010 |
| CN | 201708399 U | 1/2011 |
| CN | 201717435 U | 1/2011 |
| CN | 201741935 U | 2/2011 |
| CN | 201741937 U | 2/2011 |
| CN | 102280732 B | 12/2011 |
| CN | 202076514 U | 12/2011 |
| CN | 102437482 A | 5/2012 |
| CN | 102544812 A | 7/2012 |
| CN | 202423735 U | 9/2012 |
| CN | 202513384 U | 10/2012 |
| CN | 202737282 U | 2/2013 |
| CN | 103081253 A | 5/2013 |
| CN | 203242848 U | 10/2013 |
| CN | 103427263 A | 12/2013 |
| CN | 203326282 U | 12/2013 |
| CN | 203481540 U | 3/2014 |
| CN | 103762479 A | 4/2014 |
| CN | 203521683 | 4/2014 |
| CN | 204577669 U | 8/2015 |
| TW | M288035 | 2/2006 |
| TW | M357077 | 5/2009 |
| TW | M398256 | 2/2011 |
| TW | M398262 | 2/2011 |
| TW | I427870 | 6/2011 |
| TW | M414692 | 10/2011 |
| TW | M426911 | 4/2012 |
| TW | M443957 | 12/2012 |
| TW | M453995 | 5/2013 |
| TW | M454654 | 6/2013 |
| TW | M475728 | 4/2014 |
| WO | WO2009147791 | 12/2009 |
| WO | WO2013/020359 | 2/2013 |

OTHER PUBLICATIONS

Universal Serial Bus Type-C Cable and Connector Specification Revision 0.7 Working Draft Jan. xx, 2014.

(56) References Cited

OTHER PUBLICATIONS

Universal Serial Bus Type-C Cable and Connector Specification Revision 1.0 Aug. 11, 2014.

* cited by examiner

PLUG CONNECTOR INSERTABLE IN TWO ORIENTATIONS AND HAVING A METALLIC SHIELD PLATE WITH ARMS WITH HOOK STRUCTURES

CROSS REFERENCE TO RELATED APPLICATIONS

This application is a continuation application of Ser. No. 14/542,550 filed Nov. 15, 2014 which is a continuation application of Ser. No. 14/477,889 filed Sep. 5, 2014, of Ser. No. 14/497,205 filed Sep. 25, 2014, and of Ser. No. 14/517,941 filed Oct. 20, 2014, and claims the benefit of, and priority to, U.S. Provisional Patent Application No. 61/917,363, filed Dec. 18, 2013, and Provisional Patent Application No. 61/926,270, filed Jan. 11, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

US Patent Publication No. 20130095702A1 discloses a dual orientation plug connector, which has a connector tab with first and second major opposing sides and a plurality of electrical contacts carried by the connector tab. The plurality of contacts may include a first set of external contacts formed at the first major side and a second set of external contacts formed at the second major side. The first plurality of contacts may be symmetrically spaced with the second plurality of contacts and the connector tab may be shaped to have 180 degree symmetry so that it can be inserted and operatively coupled to a corresponding receptacle connector in either of two insertion orientations.

A receptacle connector corresponds to the plug connector. A sensing circuit in the receptacle or the electronic device in which the receptacle connector is housed can detect the orientation of the contacts and switch internal connections to the contacts in the connector jack as appropriate. When the contacts are more, the sensing circuit is more complicated, which will waste software switches or hardware switches.

Hence, a new and simple electrical plug connector and the complementary receptacle connector are desired.

SUMMARY OF THE INVENTION

Accordingly, the object of the present invention is to provide an electrical connector assembly comprising a plug connector and a receptacle connector intending to be inserted with the plug connector. The plug connector includes an insulative housing with mating slot therein, a plurality of contacts disposed in the insulative housing by two sides of the mating slot, and a pair of side arms located by two opposite ends of the mating slot in a horizontal transverse direction. The receptacle connector includes an insulative housing defining a horizontal mating tongue; a plurality of contacts disposed in the housing with contacting sections exposed upon two opposite surfaces of the mating tongue; and a monolithic horizontal metallic shielding plate disposed and extending substantially fully the mating tongue. The shielding plate of the receptacle connector defines side protruding edge sections exposed outside of corresponding side edges of the mating tongue and a notch structure on each side protruding edge section, the pair of side arms of the plug connector each defines a hook structure to engagement with the notch structures of the receptacle connector during mating.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
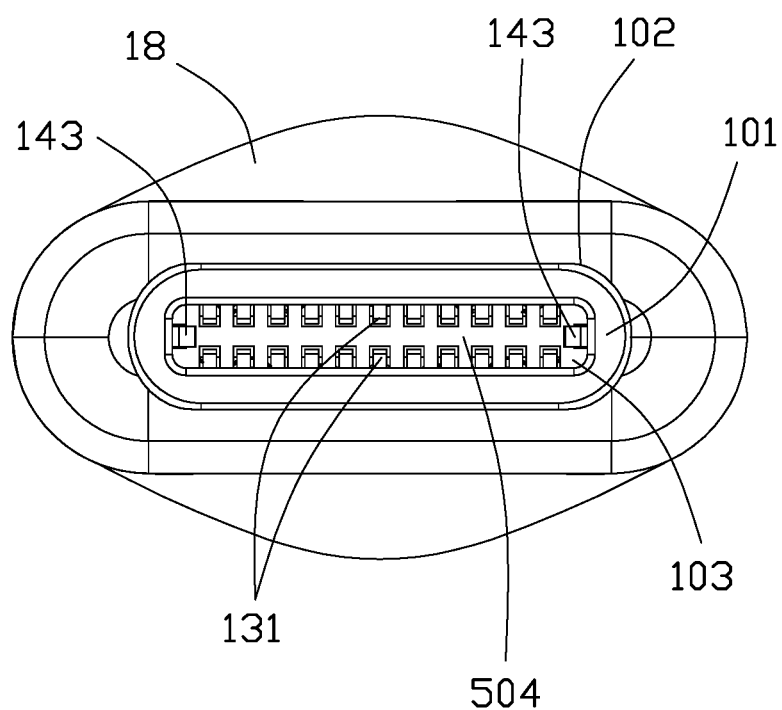
FIG. 1 is a front elevational view of a plug connector according to a first embodiment of the invention.
Figure 2:
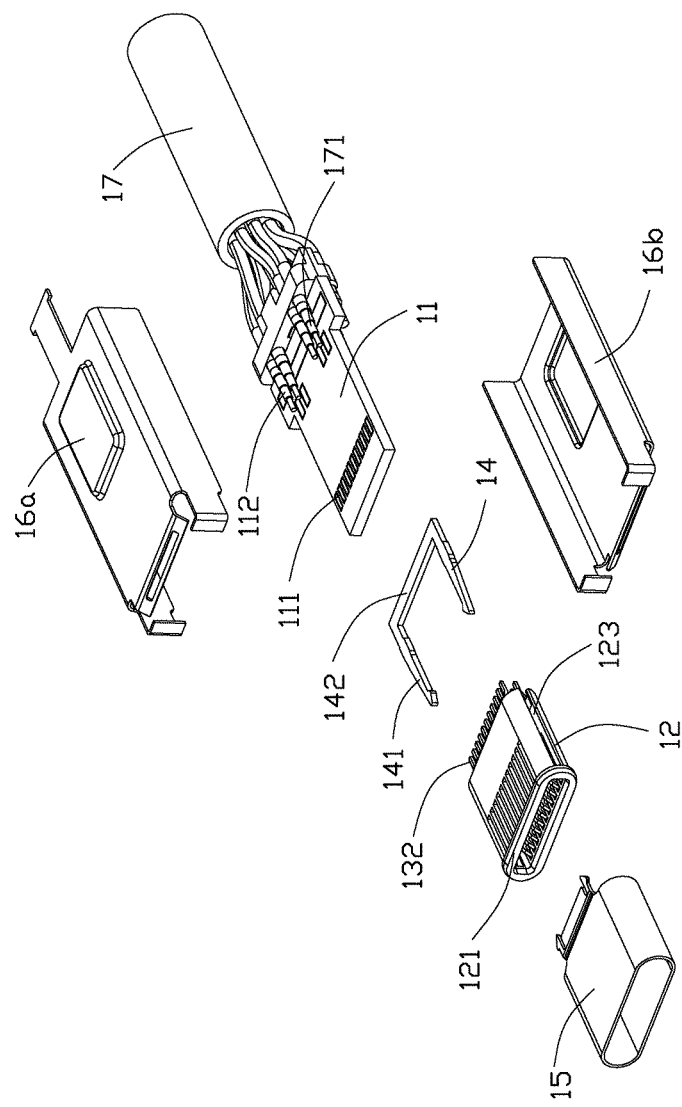
FIG. 2 is an exploded perspective view of the plug connector of FIG. 1.
Figure 3:
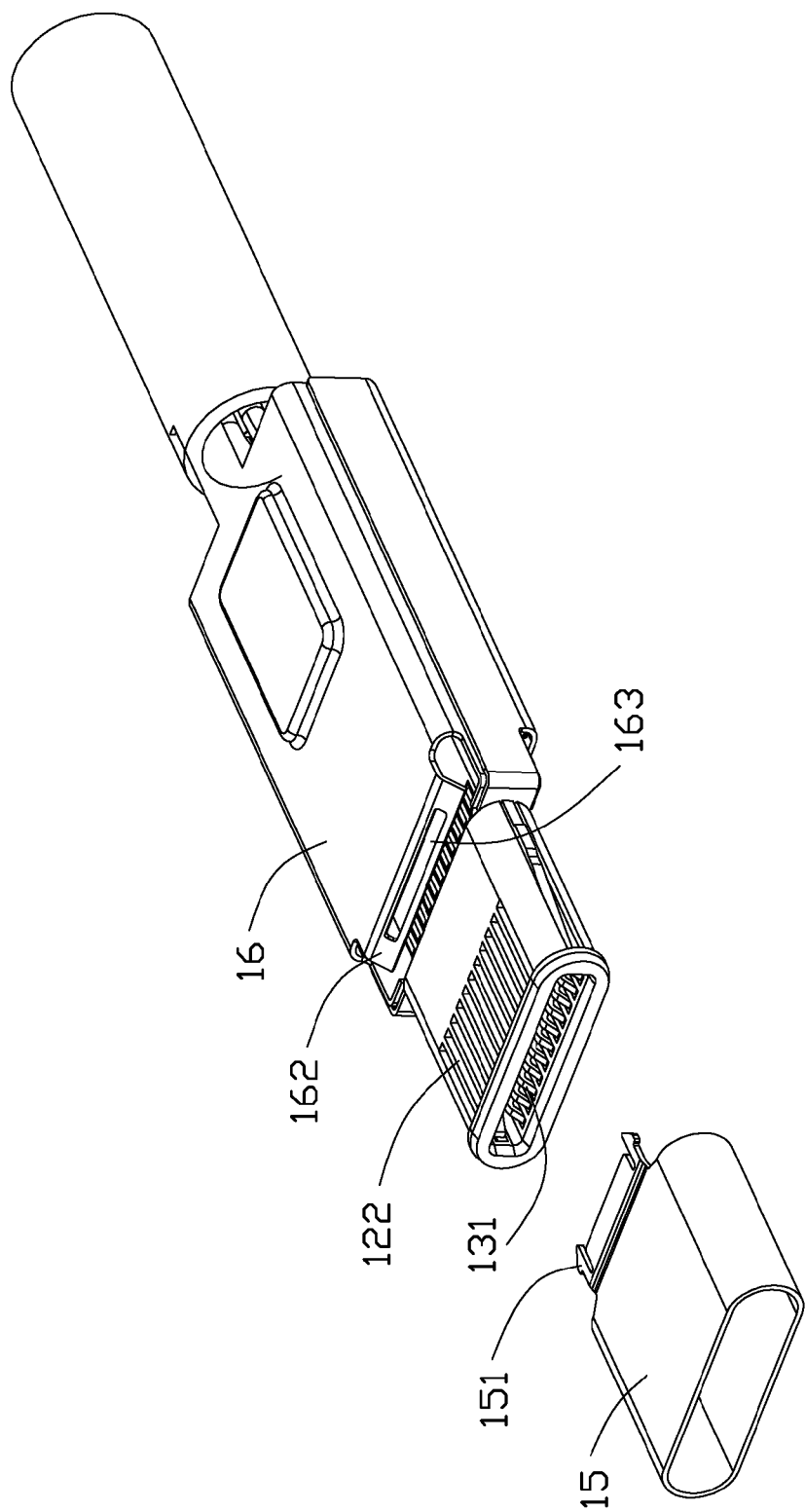
FIG. 3 is a partially assembled perspective view of the plug connector of FIG. 2.
Figure 4:
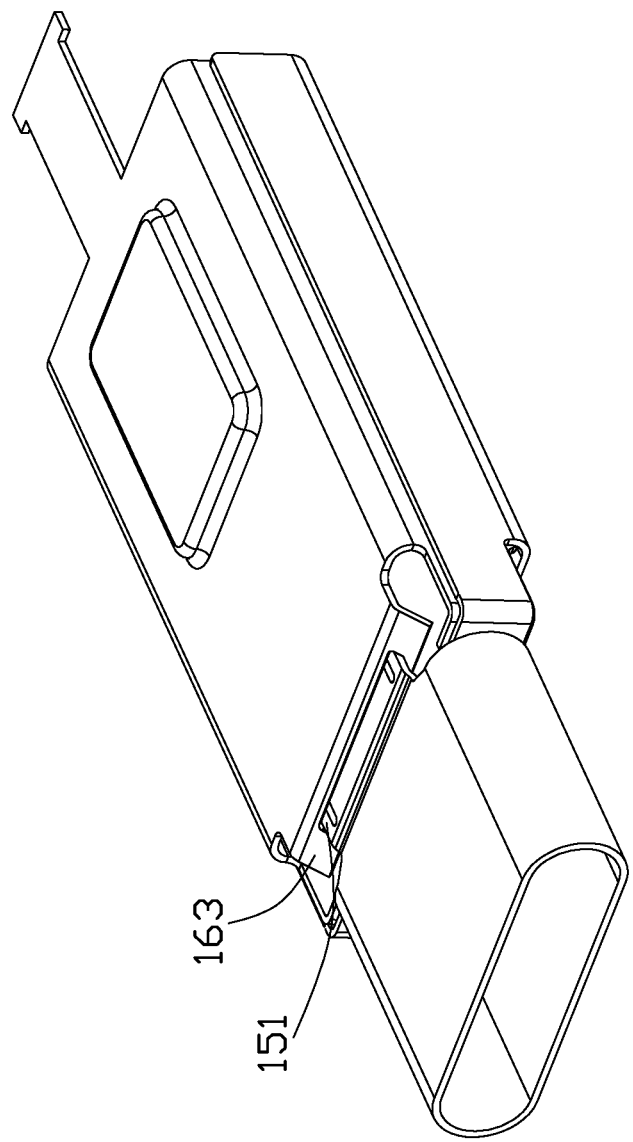
FIG. 4 is an assembled perspective view of a front shielding shell and a pair of rear shielding shells of the plug connector of FIG. 2.
Figure 5:
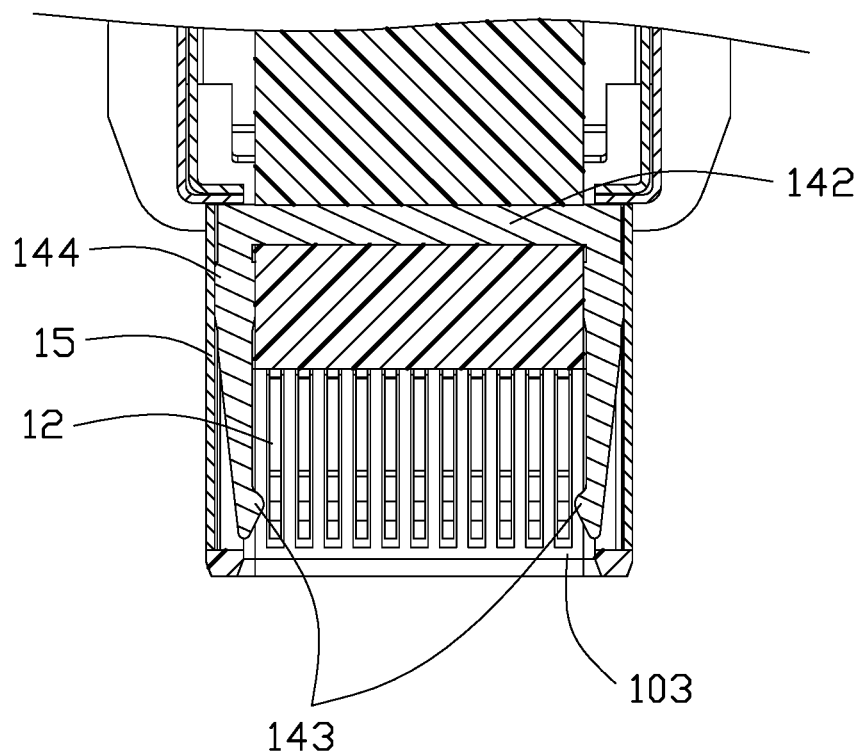
FIG. 5 is an enlarged cross-section illustrating view of the plug connector of FIG. 1.

Referring to FIGS. 1-5, the instant invention discloses a first connector of a plug connector type 100 defines a front mating end 101 with a capsular configuration outlet 102 and a rectangular mating slot 103, which can be inserted into a second connector of a receptacle connector 200 mounted on a printed circuit board 900, either in either of two insertion orientations. The plug connector 100 includes a paddle card 11 with front circuit pads 111 and rear circuit pads 112 on two opposite surfaces of the paddle card 11. An insulative housing 12 located in front of the paddle card 11, is enclosed in a front metallic shell 15 in a seamless metallic sleeve type and defines the mating slot 103 between two walls 121 each equipped with a plurality of deflectable contacts 13 in the corresponding passageways 122, respectively, each having a front contacting section 131 extending into the mating slot 103 and a rear mounting section 132 mechanically and electrically connected to the corresponding front circuit pads 111, respectively. A U-shaped directly stamped type latch clip 14 with two side arms 141 linked by a transverse bar 142, is disposed in corresponding raceway 123 therein. The pair of side arms 141 each with a front hook structure 143 extends forwards and face inwardly toward the mating slot 103 in a transverse direction. As best shown in FIG. 5, the transverse bar 142 is located between said two rows of contacts 13 and in front of the rear mounting section 132, the latch clip 14 defines side edges 144 mechanically and electrically contact an interior surface of the front metallic shell 15 for constant self-grounding in the plug connector. A cable 17 extends rearwardly from the paddle card 11 and includes therein a plurality of wires 171 respectively connected to the rear circuit pads 112 of the paddle card 11. The front metallic shell 15 is snugly cover on the insulative housing 12 and a rear metallic shielding shell including halves 16a, 16b sounding a rear end of the housing 12, the paddle card 11 and a front of cable 17. As best shown in FIGS. 3-4, the front shell 15 discrete from while links to the rear shell including halves 16a, 16b to enclose the insulative housing 12. A rear locking portion 151 with two outward hooks extend rearwards from the front capsular sleeve of the front shell 15, the rear shells 16 defines a front edge 162 with a lengthwise locking slot 163 thereon slanting towards the mounting sections 132 of the contacts 13 so that the locking portions 151 is inserted into the locking slot 163 and the hooks latch the inner sides of the locking slot 163. A cover 18 is overmolded on the rear shell 16, the paddle card 11 and the cable 17 to finalize the whole plug connector 100.

Figure 6:
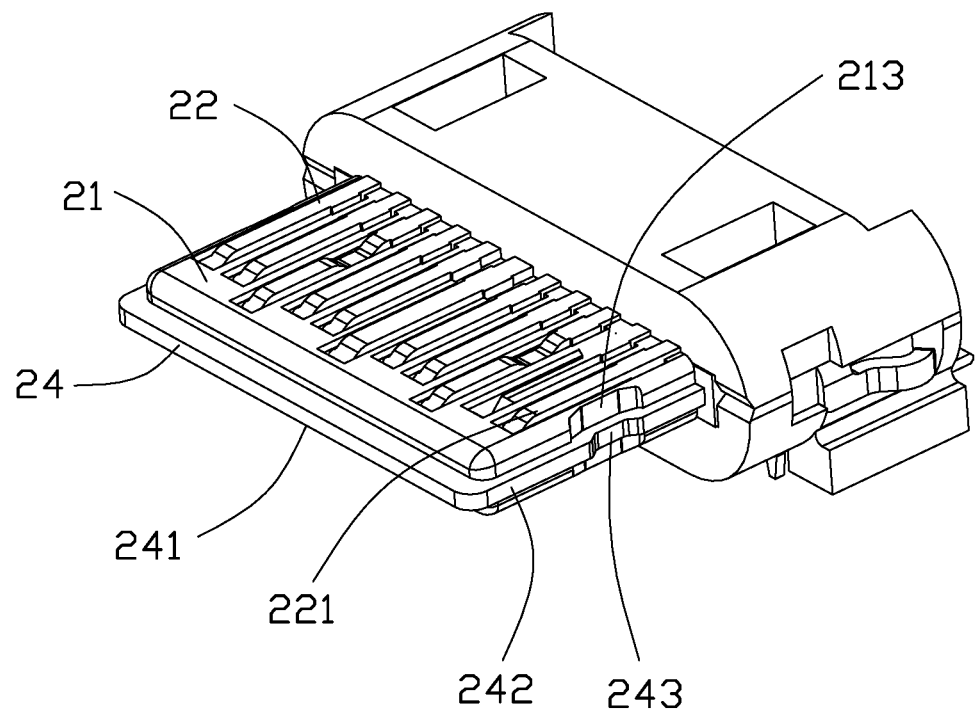
FIG. 6 is an assembled front perspective view of a receptacle connector without a shielding shell, which is adapted for mating with the plug connector of FIG. 1.
Figure 7:
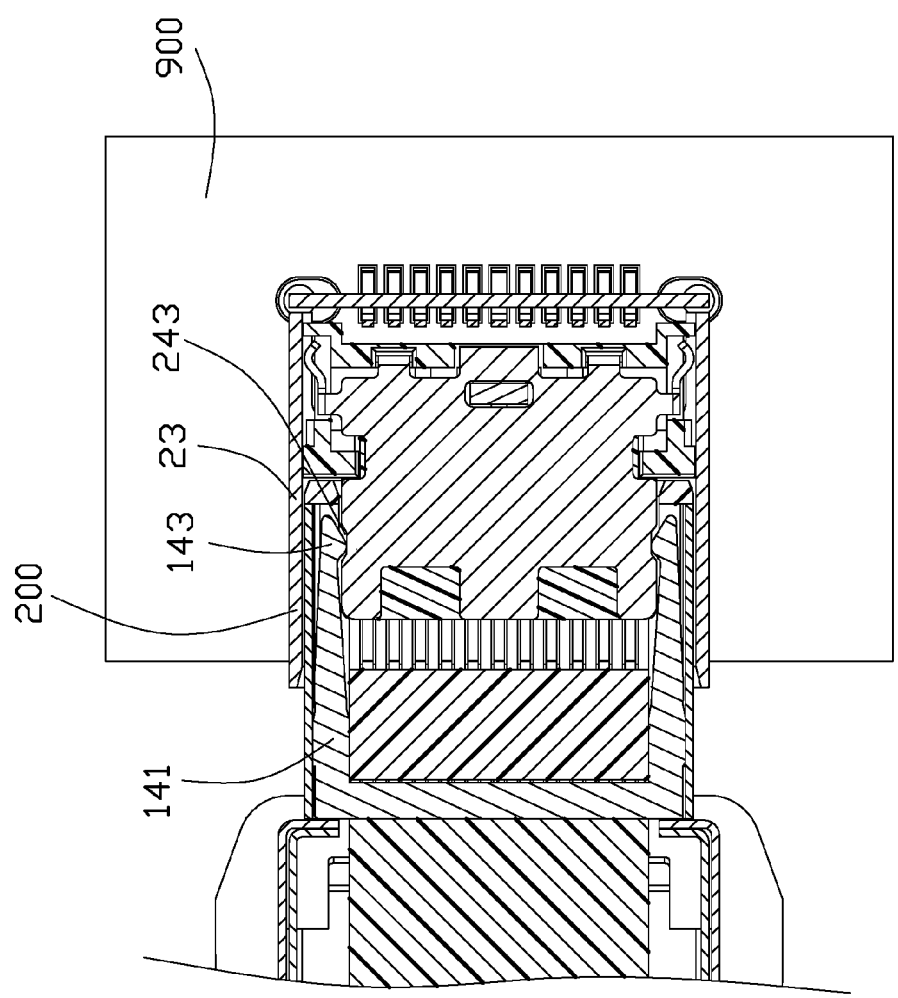
FIG. 7 is a cross-section horizontal illustrating view of the plug connector and the receptacle connector to show engagement between the shielding plate and the latch clip when mating.
Figure 8:
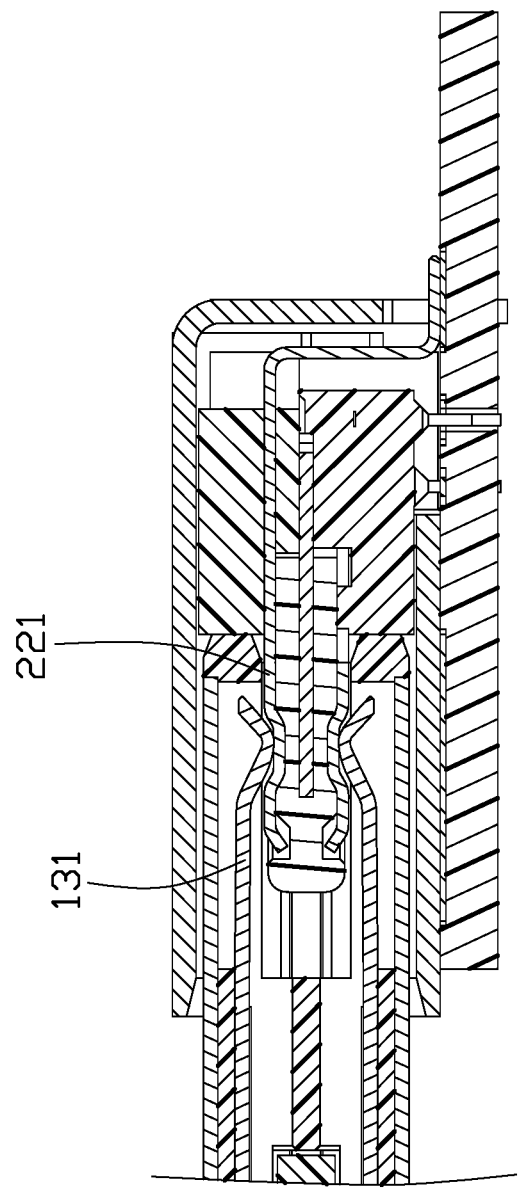
FIG. 8 is a cross-section vertical illustrating view of the plug connector and the receptacle connector to show engagement between contacts when mating.

The plug connector 100 is mateable with the complementary receptacle connector 200 mounted upon the mother board 900 as best shown in FIGS. 6-7. The receptacle connector 200 includes a forwardly extending mating tongue 21, and a plurality of stationary contacts 22 with contacting sections 221 exposed upon two opposite surfaces of the mating tongue 21 and mounting sections (not shown) soldered upon the printed circuit board. A capsular metallic shielding shell 23 encloses the mating tongue 21 to define therein a mating port in which the mating tongue 21 forwardly extends, and further unitarily forms a plurality of mounting legs (not shown) mounting to the printed circuit board 900.

A metallic shielding/grounding plate 24 is disposed in the mating tongue 21 with the reinforcement function, front protruding edge sections 241 exposed outside of the corresponding edges of the mating tongue 21 for preventing damage due to incorrect/tilted mating of the plug connector, and a pair of side notch 243 on two lateral sides 242 for engagement with the front hook structures 143 of the plug connector to implement mutual grounding between the shielding plate 14 of the receptacle connector 200 and the latch clip 14 of the plug connector during mating. Understandably, similar to what is disclosed in the parent applications, the mating tongue 21 and the shielding plate 24 are assembled via an insert molding process, and the contacts 22 are retained in the corresponding terminal module via another insert molding process and successively assembled upon the mating tongue 21 in the vertical direction. Please notes, in this embodiment, the mating tongue 21 forms a notch 213 in each side edge region and aligns with the notch 243 of the shielding plate 24, the side protruding edge sections 242 exposed outside of the corresponding side edges of the mating tongue 21 for forgiving tilted mating of the plug connector in a transverse direction, the notch structures 242 of the shielding plate in the mating tongue are exposed in that notches 213 so as to allow the hook structure 143 of the plug connector to be mechanically and electrically engaged within the notch 243 to implement mutual grounding between the shielding plate of the receptacle connector and the latch clip of the plug connector during mating. Understandably, the notch structure 243 contributes the primary function, the notch structure 213 of the mating tongue will provide an auxiliary engagement to the hook structures 143, especially the hook structures 143 offset from the notch 243.

Figure 9:
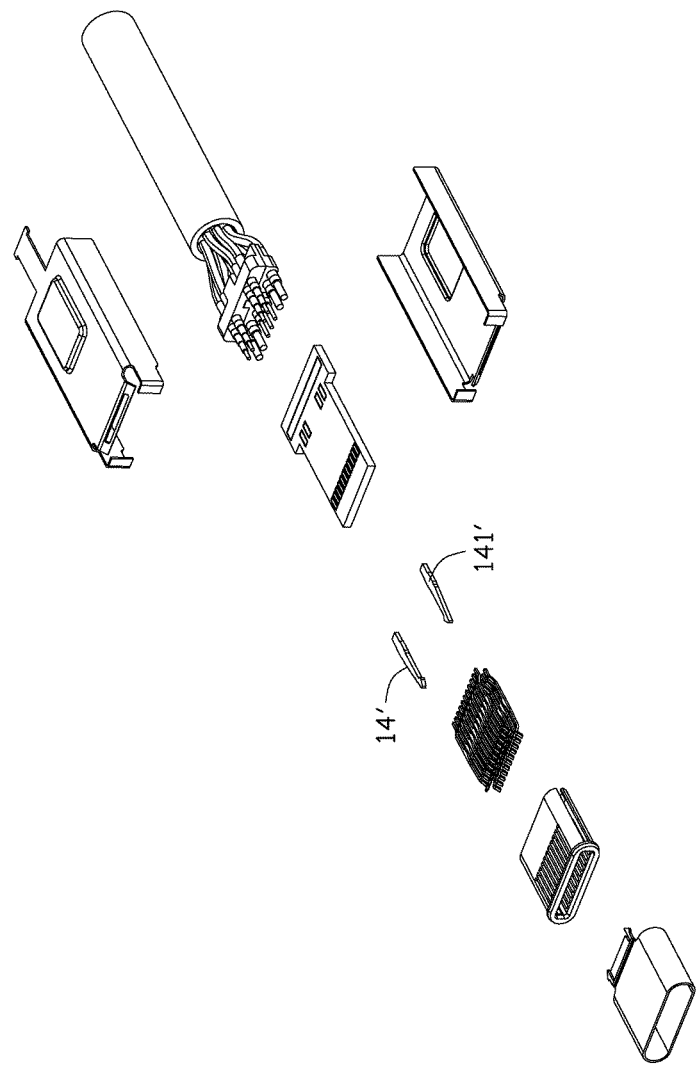
FIG. 9 is an exploded perspective view of a plug connector according to another embodiment of the instant invention, to show the latch clip includes two separate side arms.
Figure 10:
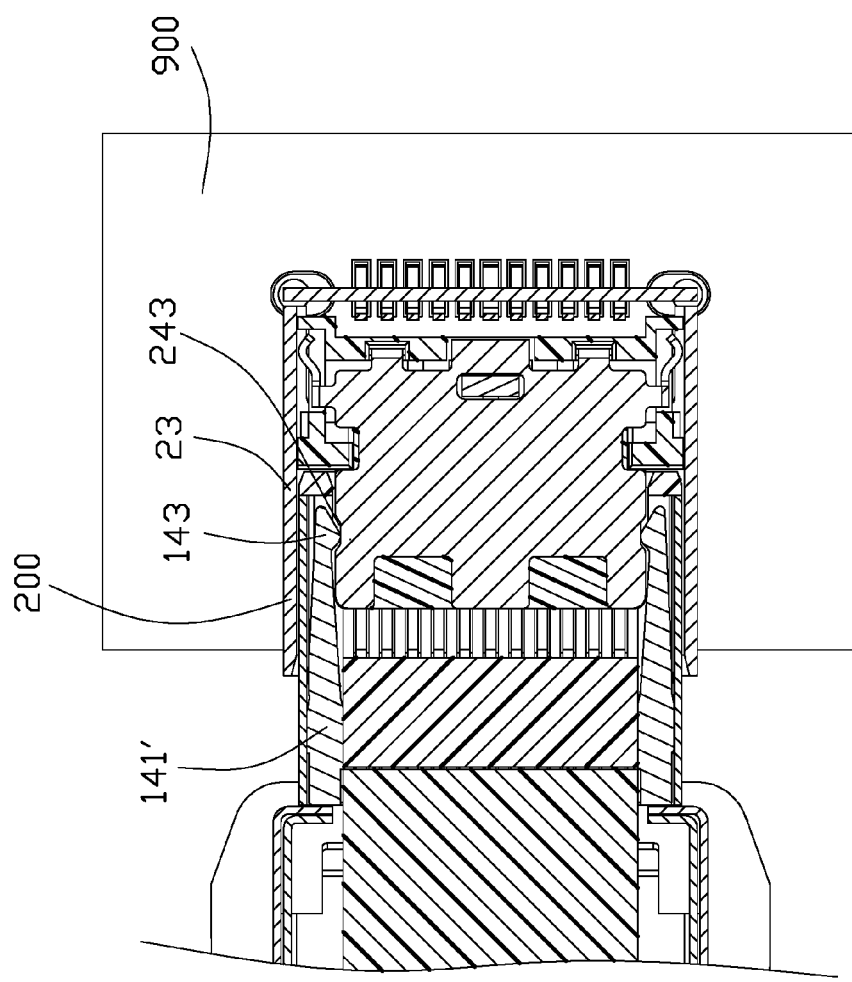
FIG. 10 is a cross-section horizontal illustrating view of the plug connector of FIG. 9 and the receptacle connector to show engagement between the shielding plate and the latch clip when mating.

FIGS. 9-10 shows the latch clip 14' includes a pair of side arms 141' discrete from each other instead of linked together wherein each side arm 141' is retained by the housing 21 and the sleeve 15.

Figure 11:
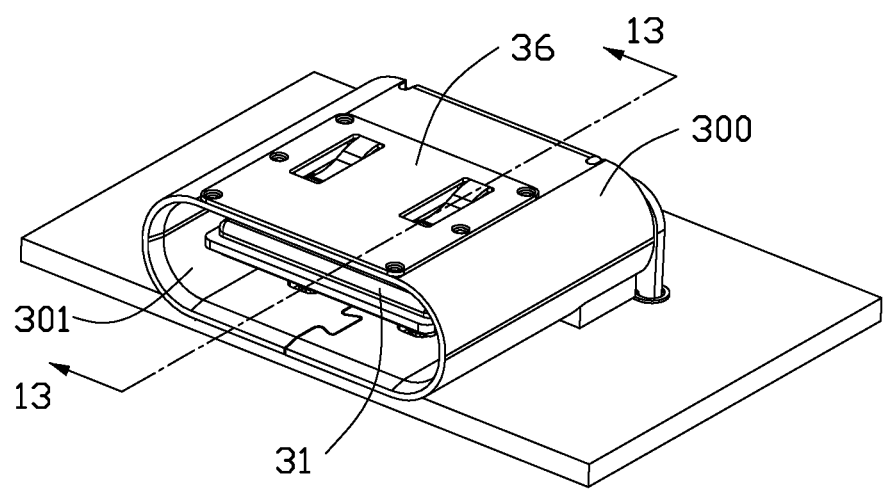
FIG. 11 is an assemble perspective view of a receptacle connector mounting to a printed circuit board according to the second embodiment of the instant invention, which has an improvement of the shielding shell based on the first embodiment.
Figure 12:
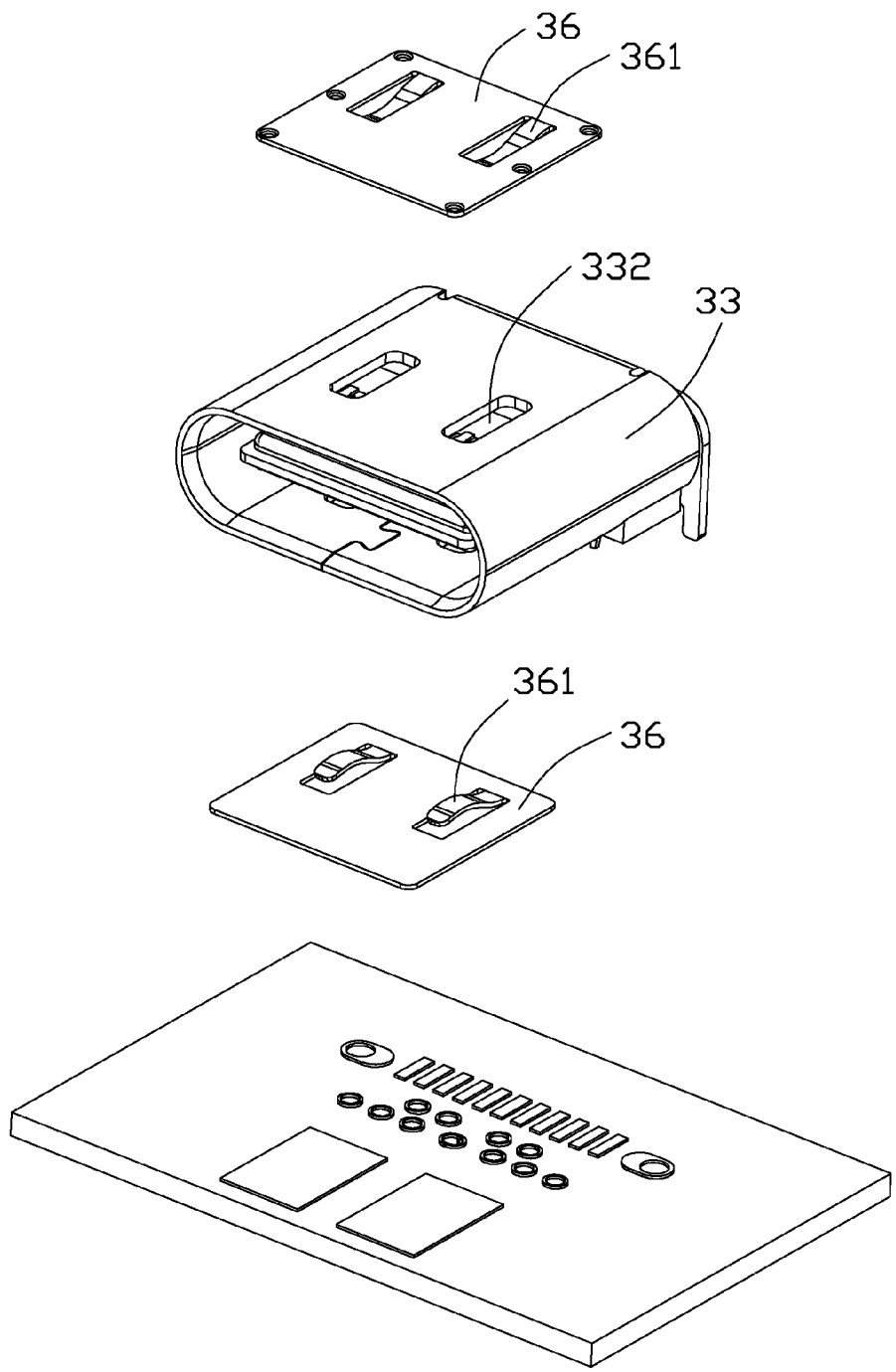
FIG. 12 is an exploded perspective view of the receptacle connector, the EMI/RFI plate and the printed circuit board of FIG. 11.
Figure 13:
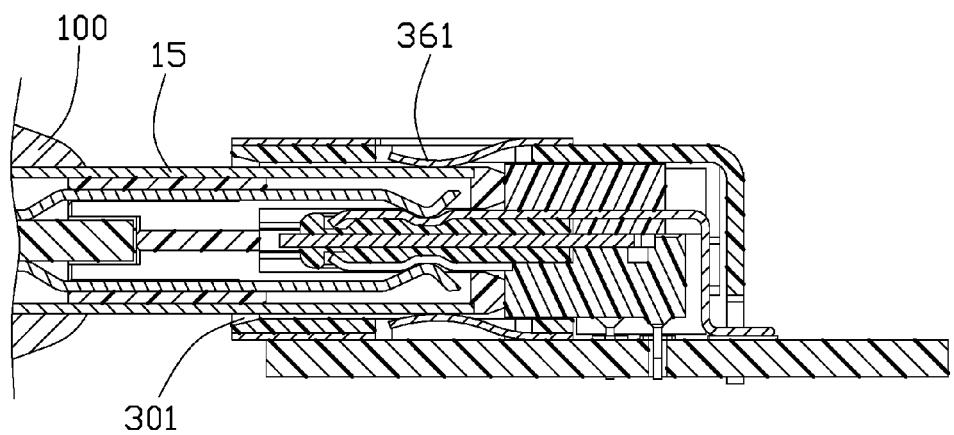
FIG. 13 is an illustrative cross-sectional view of the receptacle connector and the printed circuit board taken along lines 13-13 of FIG. 13 mated with the plug connector to show how the spring finger works.

FIGS. 11 to 21 show variants of the shielding shell of receptacle connectors. Referring to FIGS. 11-13, the receptacle connector 300 mounted upon the printed circuit board, includes an insulative housing with a forwardly extending mating tongue 31 therewith, and a metallic shell 23 enclosing the housing to define a mating cavity 301 in which the mating tongue 31 is disposed. The shell 33 defines a plurality of openings 332 and a pair of (EMI/RFI) grounding plate 36, each of which, in this embodiment, is thinner and more flexible than the shell 33, are attached to the shell 33 via welding and define a plurality of spring tangs 361 aligned with the corresponding openings 332 and extending into the mating cavity 301 via the corresponding openings 332 for contacting the shell 15 of the plug connector 100 inserted into the mating cavity 301. Understandably, to enhance the shielding effect without EMI leaking, the upper grounding plate 36 may be of a folded manner having a lower layer with the spring tangs stamped therefrom and an upper layer with complete shielding structure without openings therein to be stacked upon the lower layer.

Figure 14:
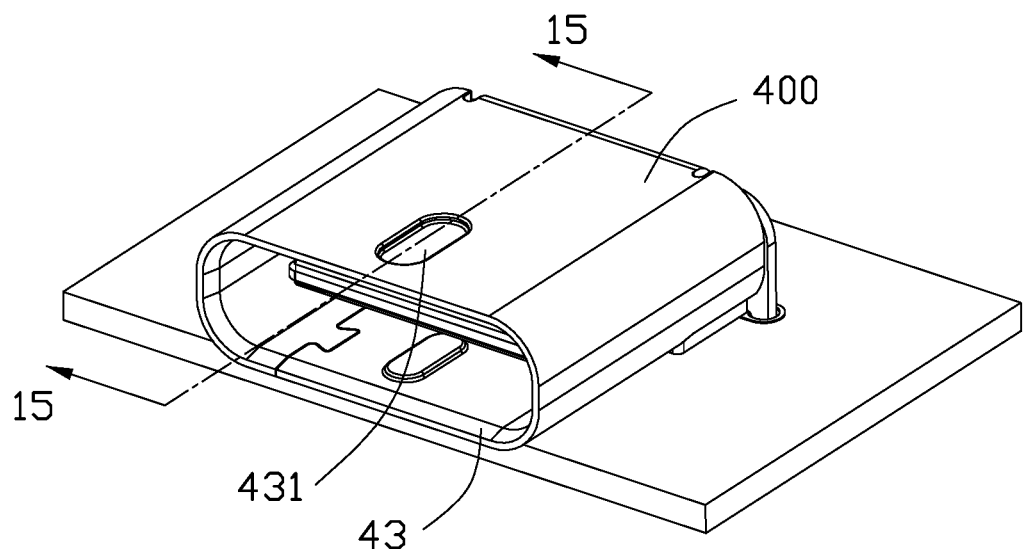
FIG. 14 is an assembled perspective view of a receptacle connector and the printed circuit board according to the third embodiment of the instant invention.
Figure 15:
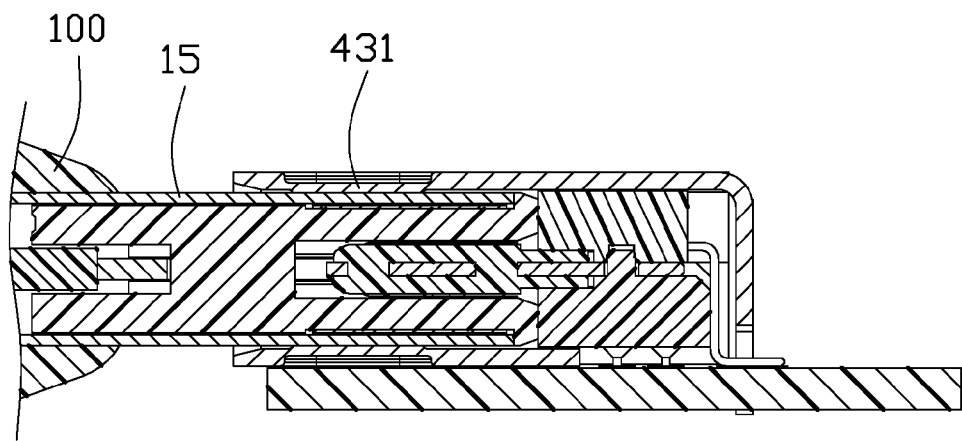
FIG. 15 is an illustrative cross-sectional view of the receptacle connector and the printed circuit board taken along lines 14-14 of FIG. 14 mated with the plug connector to show how the dimple works.
Figure 16:
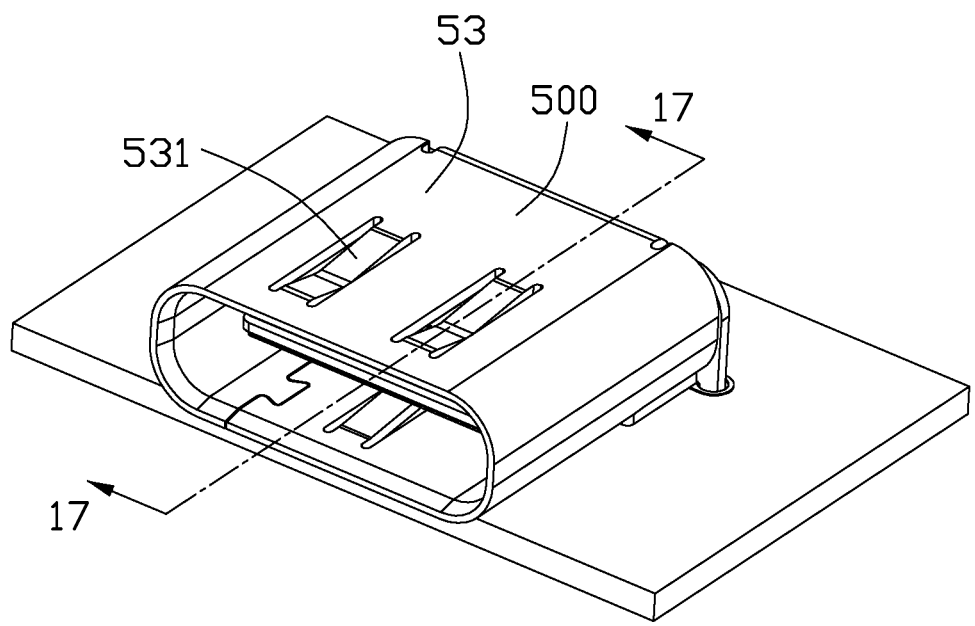
FIG. 16 is an assembled perspective view of a receptacle connector and the printed circuit board according to the fourth embodiment of the instant invention.
Figure 17:
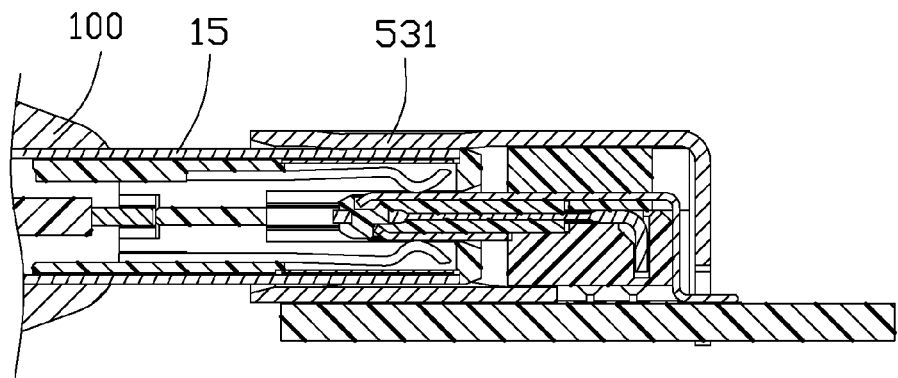
FIG. 17 is an illustrative cross-sectional view of the receptacle connector and the printed circuit board taken along lines 16-16 of FIG. 16 mated with the plug connector to show how the fixed beam works.

Referring to FIGS. 14-15, the shell 43 of a receptacle connector 400 forms the dimple structure 431 to contact the shell 15 of the inserted plug connector 100. Referring to FIGS. 16-17, the shell 53 of a receptacle connector 500 forms a closed end structure 531, i.e., the fixed beam type, to contact the shell 15 of the inserted plug connector 100.

Figure 18:
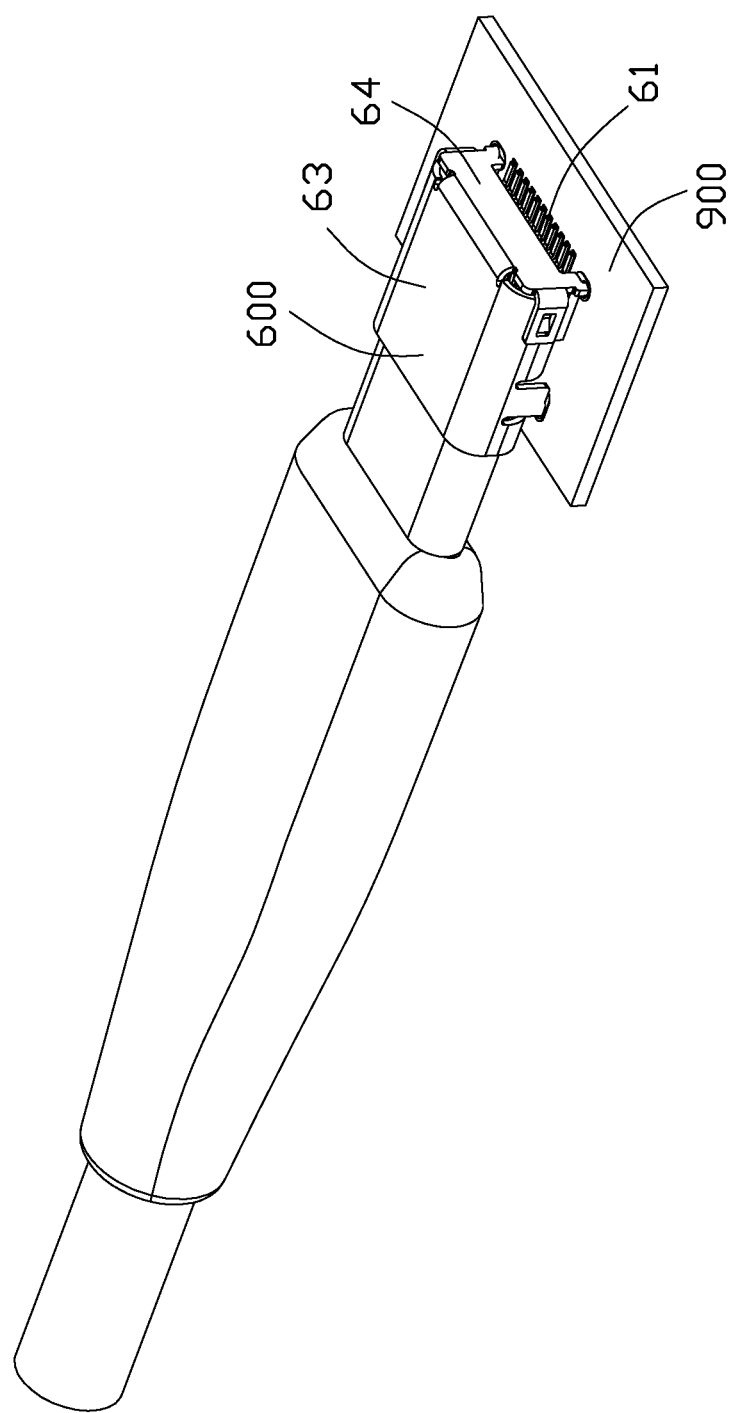
FIG. 18 is an assembled perspective view of a receptacle connector and a printed circuit board mated with the plug connector, according to the fifth embodiment of the instant invention.
Figure 19:
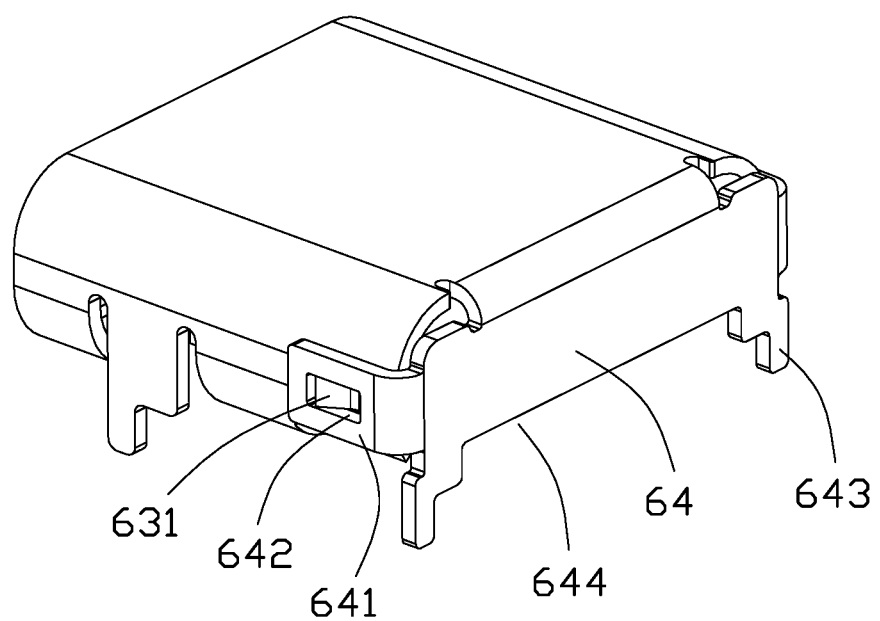
FIG. 19 is a top and rear perspective view of the shell of the receptacle connector of FIG. 19 to show how the rear cover is locked to the main body of the shell.
Figure 20:
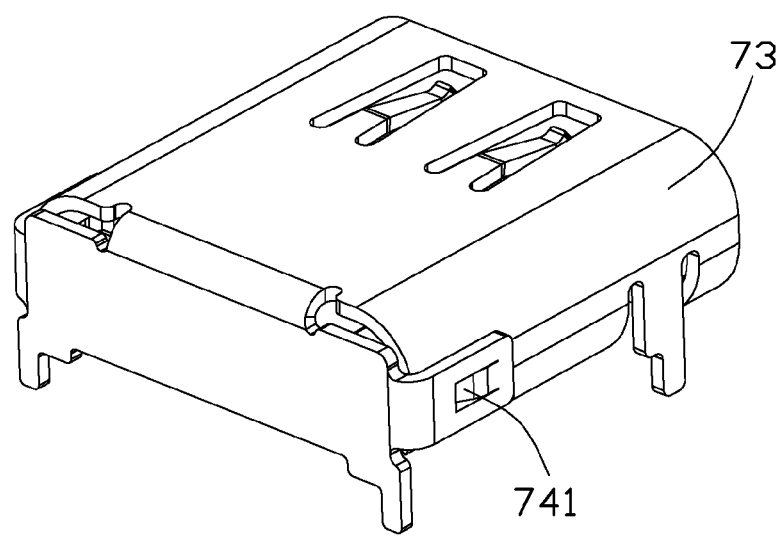
FIG. 20 is a top and rear perspective view of a metallic shell of a receptacle connector according to another embodiment of the instant invention.
Figure 21:
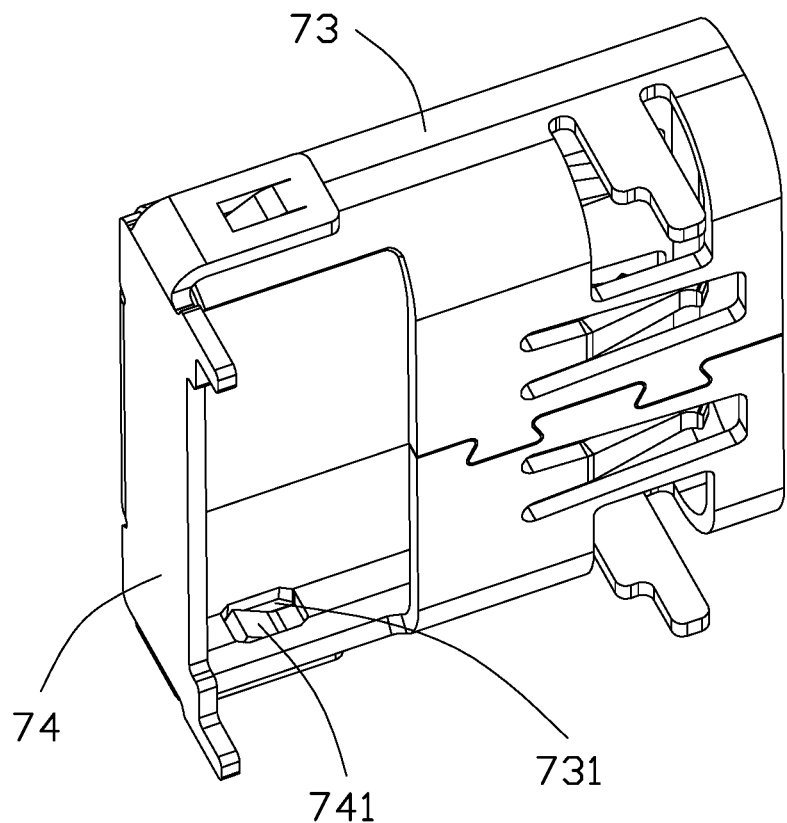
FIG. 21 is a bottom and rear perspective view of the shell of the receptacle connector of FIG. 20 to show how the rear cover is locked to the main body of the shell.

Referring to FIGS. 18-19, the shell 63 of a receptacle connector 600 includes a rear cover 64 equipped with a locking lug 641 having a locking opening 642 therein to have the corresponding locking protrusion 631 of the side walls of main body of the shell 63 locked therein. The rear cover 64 includes a pair of mounting legs 643 soldering to the printed circuit board. In this embodiment, the rear cover 64 intimately contacts the rear side of the insulative housing so as to efficiently stop the rearward movement of the housing when the housing is urged rearwardly by the inserted plug connector during mating. Because of the mounting legs 643, the rearward force imposed upon the rear cover 64 may be transferred to the printed circuit board 900. On the other hand, understandably the rear lower edge of the capsular configuration of the shell 63 stops the forward movement of the housing so as to cooperate with the rear cover 64 for retaining the shell 63 with regard to the housing in the front-to-back direction. In this embodiment, the rear cover 64 defines a cutout 644 between the pair of mounting legs 643 to allow the horizontal mounting tails 61 of the contact to rearwardly extend beyond the rear cover 64. Alternately, for enhancing the shielding effect, the tails 61 may be arranged in a through hole type so as to have the rear cover 64 be a complete piece without such a cutout 644. FIGS. 20-21 shows another similar design wherein the difference with regard to the embodiment of FIGS. 18-19 is that in this embodiment, the shell 73 includes a locking opening 731 to lock the locking tab 741 of the rear cover 74 to secure the rear cover 74 to the side wall of the shell 73.

However, the disclosure is illustrative only, changes may be made in detail, especially in matter of shape, size, and arrangement of parts within the principles of the invention.

What is claimed is:

1. A receptacle connector adapted to be mounted to a printed circuit board for mating with a plug connector, and including:
    an insulative housing defining a mating tongue;
    a plurality of contacts disposed in the housing with contacting sections exposed upon two opposite surfaces of the mating tongue;
    a monolithic horizontal metallic shielding plate disposed and extending substantially fully the mating tongue; and
    a metallic shield enclosing the insulative housing to define a mating cavity with the mating tongue extending therein, which is inserted with the plug connector in either of two insertion orientations, the metallic shield including opposite top and bottom walls and two opposite side walls, and further including a rear wall having two locking lugs latched to the corresponding opposite side walls, respectively; wherein
    the shielding plate of the receptacle connector defines side latching edge sections exposed upon corresponding side edges of the mating tongue and a notch structure formed on each of the side latching edge sections for latching to a corresponding metallic side arm of the plug connector during mating.

2. The receptacle connector as claimed in claim 1, wherein the rear wall further includes at least one leg around a bottom edge for mounting to the printed circuit board for reinforcement.

3. The receptacle connector as claimed in claim 1, wherein each of the side walls defines a locking opening and each of the locking lugs defines a locking tab, the locking tabs are latched in the locking openings to secure the rear cover to the side walls of the metallic shell.

4. The receptacle connector as claimed in claim 1, wherein the locking lugs bend forwards from lateral edges of the rear cover and press against the side walls of the metallic shell.

5. The receptacle connector as claimed in claim 1, wherein the shielding plate is assembled within the mating tongue as one piece via an insert molding process, and the contacts are formed within a terminal module via another insert molding process and successively assembled to the mating tongue in a vertical direction.

6. The receptacle connector as claimed in claim 1, wherein the mating tongue further defines a notch corresponding each notch structure of the shielding plate, and the notch structure of the shielding plate slightly protrudes beyond the notch of the mating tongue along a transverse direction.

7. A plug connector adapted to be inserted into a receptacle connector mounted on a printed circuit board in either of two insertion orientations, the plug connector including:
    an insulative plug housing with a mating slot therein,
    a plurality of plug contacts disposed in the insulative plug housing by two sides of the mating slot in a vertical direction, and
    a pair of metallic side arms located by two opposite ends of the mating slot in a transverse direction perpendicular to the vertical direction; wherein
    the pair of side arms each defines a hook structure at a front distal end thereof, the two hook structures protrude toward each other and into the mating slot in the transverse direction.

8. The plug connector as claimed in claim 7, wherein the pair of side arms are unitarily linked by a transverse bar to commonly form a U-shaped latch.

9. The plug connector as claimed in claim 8, wherein said U-shaped latch lies in a same plane and is stamped from a same sheet metal so as to have thereof a thickness direction be parallel to the vertical direction.

10. The plug connector as claimed in claim 7, wherein the plug connector further includes a front metallic shell enclosing the plug housing, and the front metallic shell is essentially of a seamless sleeve.

11. The plug connector as claimed in claim 10, wherein the plug connector comprises a paddle card located behind the insulative plug housing and a cable, the plug contacts connect with a front portion of the paddle card and the cable extends rearwards from a rear portion of the paddle card.

12. The plug connector as claimed in claim 11, wherein the plug connector further comprises a rear metallic shell enclosing the paddle card and a front portion of the cable.

13. The plug connector as claimed in claim 11, wherein the front metallic shell and the rear metallic shell are linked to each other around boundary.

14. The plug connector as claimed in claim 13, wherein a rear locking portion with two outward hooks extend rearwards from the front metallic shell, the rear metallic shell defines a front edge with a lengthwise locking slot thereon, the locking portions is inserted into the locking slot and the hooks latch the inner sides of the locking slot.

15. The plug connector as claimed in claim 10, wherein the pair of side arms are mechanically and electrically connected to the front metallic shell in the transverse direction.

16. The plug connector as claimed in claim 7, comprising a front metallic shell fitly enclosing the plug housing, wherein the pair of metallic side arms mechanically electrically connected to the front metallic shell in the transverse direction; the pair of side arms are discrete from each other and lies in a same plane so as to have thereof a thickness direction be parallel to the vertical direction.

17. A plug connector adapted to be inserted into a receptacle connector in either of two insertion orientations, the plug connector including:
- an insulative plug housing with a mating slot therein and two raceways opening to the mating slot and an exterior in a transverse direction;
- a plurality of plug contacts disposed in the insulative plug housing by two sides of the mating slot in a vertical direction perpendicular to the transverse direction, and
- a pair of metallic side arms disposed in the corresponding raceways with two hook structures at front distal ends thereof;
- wherein the two hook structures protrude toward each other and into the mating slot in the transverse direction.

18. The plug connector as claimed in claim 17, comprising a front metallic shield fitly enclosing the insulative plug housing, wherein the pair of metallic side arms are discrete from each other and lies in a same plane perpendicular to the vertical direction.

19. The plug connector as claimed in claim 18, wherein an outer sides of the pair of metallic side arms touch an inside of the front metallic shield.

20. The plug connector as claimed in claim 18, wherein the front metallic shell is essentially of a seamless sleeve.

* * * * *